(12) United States Patent
Conaghan et al.

(10) Patent No.: US 7,141,185 B2
(45) Date of Patent: *Nov. 28, 2006

(54) HIGH CONDUCTIVITY INKS WITH LOW MINIMUM CURING TEMPERATURES

(75) Inventors: Brian F. Conaghan, Princeton, NJ (US); Paul H. Kydd, Lawrenceville, NJ (US); David L. Richard, Fanwood, NJ (US)

(73) Assignee: Parelec, Inc., Rocky Hill, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 10/354,154

(22) Filed: Jan. 29, 2003

(65) Prior Publication Data

US 2004/0144959 A1 Jul. 29, 2004

(51) Int. Cl.
H01B 1/02 (2006.01)
H01B 1/06 (2006.01)
B22F 5/00 (2006.01)
B22F 7/00 (2006.01)

(52) U.S. Cl. ............ 252/514; 252/500; 252/511; 252/512; 106/1.13; 106/1.15; 106/1.19; 427/216; 427/220; 427/596; 430/108.3; 430/119; 156/230; 156/233; 75/255; 524/439

(58) Field of Classification Search ............ 252/500, 252/512, 514; 106/1.13, 1.15, 1.16, 1.19, 106/1.18, 1.23; 427/216, 220, 596, 96; 430/180.3, 430/119, 180.4; 428/357, 201, 202, 208; 156/230, 233; 75/255; 524/439

See application file for complete search history.

(56) References Cited

U.S. PATENT DOCUMENTS

| | | | |
|---|---|---|---|
| 3,454,518 A | 7/1969 | Kelly | 260/31.4 |
| 4,186,244 A | 1/1980 | Deffeyes et al. | 428/570 |
| 4,289,534 A * | 9/1981 | Deffeyes et al. | 106/1.14 |
| 4,371,459 A * | 2/1983 | Nazarenko | 252/514 |
| 4,499,010 A * | 2/1985 | Tanino et al. | 252/512 |
| 4,921,623 A * | 5/1990 | Yamaguchi et al. | 252/512 |
| 4,950,423 A * | 8/1990 | Sullivan | 252/512 |
| 4,981,730 A * | 1/1991 | Zaleski | 427/393.5 |
| 5,011,758 A | 4/1991 | Detig et al. | 430/100 |
| 5,286,415 A * | 2/1994 | Buckley et al. | 252/502 |
| 5,376,403 A | 12/1994 | Capote et al. | 427/96 |
| 5,814,248 A * | 9/1998 | Tani et al. | 252/512 |
| 5,830,389 A | 11/1998 | Capote et al. | 252/512 |
| 5,853,622 A | 12/1998 | Gallagher et al. | 252/512 |
| 5,882,722 A * | 3/1999 | Kydd | 427/96 |
| 5,985,043 A | 11/1999 | Zhou et al. | 148/24 |
| 5,985,456 A | 11/1999 | Zhou et al. | 428/414 |
| 6,017,634 A | 1/2000 | Capote et al. | 428/414 |
| 6,036,889 A | 3/2000 | Kydd | 252/512 |
| 6,143,356 A | 11/2000 | Jablonski | 427/96 |
| 6,153,348 A | 11/2000 | Kydd et al. | 430/119 |
| 6,156,237 A * | 12/2000 | Kubota et al. | 252/512 |

(Continued)

FOREIGN PATENT DOCUMENTS

JP 63-278983 11/1988

(Continued)

Primary Examiner—Mark Kopec
Assistant Examiner—Kallambella Vijayakumar
(74) Attorney, Agent, or Firm—McCarter & English, LLP (57) ABSTRACT

Conductive ink compositions which can be cured to highly conductive metal traces by means of "chemical welding" include additives which reduce the curing temperatures for use with low-temperature substrates. Conductive ink compositions can be deposited on a substrate coated with a cure temperature reducing agent to reduce the curing temperatures.

23 Claims, 8 Drawing Sheets

U.S. PATENT DOCUMENTS

| | | | |
|---|---|---|---|
| 6,214,527 B1 * | 4/2001 | Kosaka et al. | 430/319 |
| 6,274,412 B1 | 8/2001 | Kydd et al. | 438/149 |
| 6,322,620 B1 * | 11/2001 | Xiao | 106/31.92 |
| 6,372,158 B1 * | 4/2002 | Hashimoto et al. | 252/514 |
| 6,379,745 B1 | 4/2002 | Kydd et al. | 427/96 |
| 6,743,319 B1 | 6/2004 | Kydd | 156/230 |
| 7,014,885 B1 | 3/2006 | Pique et al. | |
| 2001/0046562 A1 | 11/2001 | Whitefield et al. | 427/372.2 |
| 2002/0195934 A1 | 12/2002 | Bush et al. | 313/509 |

FOREIGN PATENT DOCUMENTS

| | | | |
|---|---|---|---|
| JP | 05054716 A | 3/1993 | |
| JP | 08-283517 | * 10/1996 | |
| WO | WO 99/16556 | 4/1999 | |
| WO | WO 99/16601 | 4/1999 | |
| WO | WO 99/17352 | 4/1999 | |
| WO | WO 99/45077 | * 9/1999 | |
| WO | WO 00/29208 | 5/2000 | |
| WO | WO 01/45935 A1 | 6/2001 | |
| WO | WO 01/82315 | 11/2001 | |
| WO | WO 01/87503 | 11/2001 | |

* cited by examiner

HIGH CONDUCTIVITY INKS WITH LOW MINIMUM CURING TEMPERATURES

FIELD OF THE INVENTION

The present invention relates to electrically conductive ink compositions used in combination with agents which reduce the curing temperature of the ink compositions, and methods of producing these compositions. The compositions can be cured to form highly conductive metal traces on low temperature substrates.

BACKGROUND OF THE INVENTION

Materials for printing electrical circuits on electrical conductor substrates are disclosed in U.S. Pat. Nos. 5,882,722, 6,036,889, 6,143,356 and 6,379,745, the entire disclosures of which are expressly incorporated herein by reference, and are known as PARMOD® materials. PARMOD® materials have been developed for printing conductive circuits on polymer or paper substrates such as those used for printed wiring boards, flexible circuits and RFID antennae. Using PARMOD® materials and a simple print-and-heat process for "chemical welding" of pure metals, electrical conductors made of a single-phase continuous well-bonded metal trace are produced, rather than conductors made of individual particles that may be in adventitious contact with each other, as are found in polymer thick film containing materials. PARMOD® materials provide a desirable alternative to the conventional polymer thick film compositions that are cured at high temperatures onto ceramic or glass based substrates. PARMOD® materials are cured at temperatures which polymer and paper based substrates can withstand, and provide electrical conductivity comparable to the pure metal and at least a factor of five greater than most known polymer thick films.

PARMOD® compositions have been printed on polyimide films coated with various adhesive layers and thermally cured to create flexible printed circuits. Suitable substrates are: KAPTON® type FN with a FEP TEFLON® coating; KAPTON types KJ and LJ with low melting polyimide coatings; and polyimide substrates with a polyamic acid coating. PARMOD® compositions have been printed directly on certain grades of FR-4 epoxy-glass laminates and thermally cured to produce well-bonded rigid printed circuits.

However, a significant problem in the manufacture of PARMOD® products is that thermal treatment of PARMOD® materials can damage low-temperature substrates such as polymer or paper, and cause mechanical and dimensional instability to the printed circuits. For example, the cure temperature for "chemically welding" PARMOD® silver into circuit traces is 200° C. This curing temperature limits the choice of substrates to those with high thermal resistance, such as polyimides and epoxies. Many polymer and paper substrates cannot be processed at these temperatures.

Although low temperature sintering of metal toners has been observed on certain substrates, see, e.g., WO 01/45935, specific temperature lowering additives to promote low temperature sintering have not heretofor been defined or shown to be advantageous in the manufacture of conductive ink compositions.

Thus, there is a need for PARMOD® methods and compositions such as inks which have a minimum cure temperature that is compatible with substrates of commercial interest and which still retain the highly conductive properties of the PARMOD® materials.

SUMMARY OF THE INVENTION

The present application provides ink compositions which include agents that lower the minimum curing temperature of the ink compositions. The ink compositions of the present invention may be used on low-temperature substrates in the manufacture of highly conductive electrical circuits.

It has been found that the minimum cure temperature for the ink compositions can be reduced by adding the agents directly to the ink compositions, or by coating the substrates onto which the ink compositions are applied with the temperature lowering agents.

Accordingly, in one embodiment the invention provides a conductive ink composition comprising a reactive organic medium (ROM), a metal powder or flake, and a cure temperature lowering agent.

Preferably, the ROM comprises a metallo-organic decomposition compound, an organic reactive reagent which can react with the metal powder or flake to form a metallo-organic decomposition compound, or a mixture thereof. The metal powder or flake may be silver or other suitable metal.

The cure temperature lowering agent is selected from halogen containing polymers including polyvinylidene chloride, polyvinyl chloride, polyethylene vinyl chloride, or copolymers thereof; or organic glycol ethers, including dipropylene glycol methyl ether and the like.

The ink composition may also include an organic liquid vehicle to facilitate mixing and application of the mixture to the substrate.

The present invention also provides a method of preparing a solid pure metal conductor on a substrate comprising the steps of (a) mixing (i) a metallo-organic decomposition compound; (ii) a metal flake or powder in an amount 1 to 20 times the amount of the metallo-organic decomposition compound by weight; and (iii) a cure temperature lowering agent; (b) printing the mixture formed in step (a) onto the substrate; and (c) heating the substrate at a critical temperature less than 200° C. for a time sufficient to cure the printed mixture; wherein the printed mixture is converted into a well-consolidated well-bonded pure metal conductor.

The present invention further provides a method for preparing a solid pure metal conductor on a substrate comprising the steps of (a) mixing (i) a metallo-organic decomposition compound; (ii) a metal flake or powder in an amount 1 to 20 times the amount of the metallo-organic decomposition compound by weight; (b) coating the substrate with a cure temperature lowering agent; (c) printing the mixture formed in step (a) onto the substrate; and (d) heating the substrate at a critical temperature less than 200° C. for a time sufficient to cure the printed mixture; wherein the printed mixture is converted into a well-consolidated well-bonded pure metal conductor.

The composition of the invention is advantageously applied to low-temperature polymer substrates, paper and polyimide-based substrates using any suitable printing technique to provide circuit traces of high electrical conductivity.

DETAILED DESCRIPTION OF THE INVENTION

PARMOD® mixtures contain a reactive organic medium (ROM) and metal flakes and/or metal powders. The ROM comprises either a metallo-organic decomposition compound or an organic reagent which can form such a compound upon heating in the presence of the metal flakes and/or metal powders, or a mixture thereof. The ingredients are blended together with organic vehicles, if necessary, to improve the viscosity or dispersibility of the ink composition. These ink compositions can be printed on temperature-sensitive substrates, and cured at commercially desirable temperatures low enough so that the substrate is not damaged, to form well-consolidated electrical conductors. The curing process occurs in seconds at temperatures as much as 500° C. below the temperatures used for conventional sintering of thick film inks and pastes. As used herein the term "critical temperature" means the temperature at which the composition decomposes and is cured. Using the PARMOD® process, the metal compositions decompose at temperatures far below their known normal decomposition temperatures. During the curing process, material deposited from decomposition of the metallo-organic decomposition compound "chemically welds" the powder constituents of the PARMOD® mixture together into a solid. A porous but continuous metal trace is produced which has a density approximately half that of bulk metal and an electrical conductivity per unit mass which may be as high as half that of the bulk metal.

The compositions of the present invention improve certain PARMOD® materials by including a cure temperature lowering agent. The cure temperature lowering agent is an agent that lowers the minimum curing temperature required to "chemically weld" the ink composition, thereby improving the application of the PARMOD® materials to various low-temperature substrates, especially those substrates which can only be exposed to temperatures below 150° C. during the curing process.

This invention provides a method for curing PARMOD® compositions at temperatures compatible with polymer and paper substrates while maintaining high metal conductivity after curing. This approach has been demonstrated on a number of rigid and flexible substrates such as FR4 epoxy-glass rigid board, various high temperature flexible substrates such as KAPTON® H, but is especially attractive in that it has also been demonstrated on low temperature substrates such as polyester at heat treating temperatures as low as 120° C. to 125° C. Thus, the compositions of the present invention are suitable for use with low temperature substrates such as polyester, as well as with substrates that can withstand higher temperatures, such as paper, and those that withstand even higher temperatures, such as epoxies.

The concentration of the additive is low enough to maintain significantly higher conductivity of the resulting metal circuit traces than with polymer thick film inks.

The cure temperature lowering agent may be added directly to the PARMOD® material. Alternatively, the temperature lowering agent may be coated directly onto the substrate prior to application of the conductive PARMOD® material. In either embodiment, the ink composition is in direct contact with the temperature lowering agent, which accelerates the chemical welding of the PARMOD® material to the substrate at a lower minimum curing temperature and does not significantly interfere with the physical and chemical properties of the conductive PARMOD® material, e.g., resistivity and conductivity.

Thus, in one embodiment, the compositions of the invention comprise 1) a metal powder; 2) a ROM in which the consolidation of the metal powder to a solid conductor takes place; and 3) a cure temperature lowering agent.

The metal component is present in the composition in an amount of about 1 to 20 times the amount of the metallo-organic decomposition compound. The metal constituent comprises metal powder. It will be understood in the art that "powder" is commonly used to include both powder and flake. The metal powders suitable for use in the invention preferably have an average particle size in the range of from about 0.05 to 15 μm. Commercially available metal powders may be used. Suitable metals include copper, silver, gold, zinc, cadmium, palladium, iridium, ruthenium, osmium, rhodium, platinum, iron, cobalt, nickel, indium, tin, antimony, lead, bismuth and mixtures thereof.

The ROM provides the environment in which the metal powder mixture is bonded together to form well-consolidated conductors. Many classes of organic compounds can function as the ROM. The common characteristic which they share and which renders them effective is that they have, or can form, a bond to the metal via a heteroatom. The heteroatoms can be oxygen, nitrogen, sulfur, phosphorous, arsenic, selenium and other nonmetallic elements, preferably oxygen, nitrogen or sulfur. This bond is weaker than the bonds holding the organic moiety together, and can be thermally broken to deposit the metal. In most cases the reaction is reversible, so that the acid or other organic residue can react with metal to reform the metallo-organic compound. ROM compounds are described, e.g., in U.S. Pat. No. 6,379,745.

The ROM preferably comprises any metallo-organic compound which is readily decomposable to the corresponding metal, i.e., a metallo-organic decomposition compound, an organic reagent which can react with the metal to produce such a compound or mixtures thereof. Examples are metal soaps and the corresponding fatty acids. Other examples are metal amines and metal mercapto compounds and their corresponding amino and sulfide precursors. Specific examples of preferred ROM constituents are the carboxylic acids and the corresponding metallic soaps of neodecanoic acid and 2-ethyl hexanoic acid with silver and copper, such as silver neodecanoate.

The ROM compositions can be made by methods well known in the art and are capable of decomposition to the respective metals at relatively low temperatures.

The present invention involves the addition of certain agents to metal containing ink compositions which provide a significantly lowered minimum curing temperature to the ink compositions. The cure temperature lowering agent is added in an amount sufficient to cure the printed mixture on the substrate. The cure temperature lowering agent may be present in an amount of about 1 to 10% by weight. However, amounts outside this range, for example, as low as 0.5%, may also be used, or as are commercially or practically possible. For example, higher amounts will increase the thickness and increase decomposition time. The added cure temperature lowering agent does not adversely affect the PARMOD® cure chemistry process whereby the metal chemically welds into a continuous metal network. As a result, the conductivity of the PARMOD® materials remains significantly higher than that of polymer thick film inks.

The agents that have been shown to lower the minimum curing temperature of PARMOD® compositions to substrates include polymers, such as polyvinylidene chloride, polyvinyl chloride, polyethylene vinyl chloride, and copolymers thereof. Other halogen containing compounds are suitable, for example, those containing Br and F.

Preferred minimum cure temperature lowering agents also include organic glycol ethers, for example dipropylene glycol methyl ether, and may include dipropylene glycol butyl ether, dipropylene glycol dimethyl ether, dipropylene glycol propyl ether, and the like.

In some cases it may be convenient to add an organic liquid vehicle in an amount of 0.05 to 100 times the amount of the metallo-organic decomposition compound by weight to the compositions of the invention to enhance the printing characteristics of the compositions of the invention. Such organic liquids may be used as diluents or rheology-enhancing agents to produce a range of viscosities of printable compositions and are not reactive in the consolidation process. However, organic liquid vehicles that may additionally participate in the "welding" reaction may also be used. For example, α-terpineol has been used to reduce the viscosity of copper and silver compositions to facilitate screen printing. α-terpineol also participates in the consolidation reaction by virtue of the acid character of the OH group bonded to an unsaturated ring. Other agents commonly used in conductive ink compositions can also be added as desired to the compositions of the invention.

The constituents of the compositions are weighed out in the appropriate proportions, mixed with diluents or viscosity modifiers if needed to provide the proper consistency, and milled together by hand roll milling or machine roll milling to provide a homogeneous, printable composition. The fineness of grind of the ink typically is less than 1μ.

Substrates to which these compositions can be applied include those onto which conductive circuits are typically printed. Suitable substrates include rigid epoxy laminates, polyimide films for flexible circuits, other polymer-based electronic components, paper, such as medium card stock from Wausau, metal pads and semiconductor components. Preferred substrates include polyester-based substrates such as polyethylene terephthalate, e.g., Melinex® or Mylar®, polyethylene naphthalate, paper-based substrates, polyimide-based susbstrates, such as Apical® or Kapton®, and epoxy-based substrates, known as FR-4.

The compositions of this invention may be applied to substrates using any suitable printing technology including screen printing, rotary screen printing, gravure printing, intaglio printing, flexographic printing, letterpress printing, lithographic printing, ink jet printing and electrostatic printing. The thickness and viscosity of the applied compositions will vary depending upon the printing technique used. The compositions may range from a thickness of 350 nm with 1 centepoise (cp) viscosity using electrostatic printing, 1 to 4 microns at 50 to 200 cp by gravure printing, 4 to 50 microns by screen printing with viscosities ranging from 30,000 to 100,000 cp, and 10 to 25 microns by rotary screen printing at 3,000 cp.

According to the present invention, the agents that lower the minimum curing temperature of PARMOD® compositions can also be coated directly onto the substrate, as an alternative to being added directly to the ink compositions. The cure temperature lowering agents, including polymers such as polyvinylidene chloride, polyvinyl chloride, polyethylene vinyl chloride, and copolymers thereof, may be coated onto various substrates at a thickness of from about 1 to 15μ.

Accordingly, the ink compositions are prepared as described above, however, without the addition of the cure temperature lowering agent. The substrate is first coated with the cure temperature lowering agent, allowed to dry, and then the ink composition is applied to the substrate, using any of the printing methods described above.

The ink compositions containing the cure temperature lowering agents and the ink compositions on the substrates coated with the cure temperature lowering agents are cured by exposure to heat for a short period of time. The heating time depends upon the temperature to which the substrate can be safely exposed and can vary from about 10 seconds to 30 minutes to achieve a measurable resistivity. The curing temperature will generally be below 200° C., typically between about 120° C. to 200° C., however the temperature will depend upon the decomposition temperature of the metallo-organic compound. For example, for silver, the curing temperature of compositions of the invention will range from 120° C. to 180° C. Temperatures higher than 120° C. generally shorten curing times; thus the selection of curing temperature will be governed by practical considerations of time and commercial requirements.

The examples described below indicate how the individual constituents of the preferred compositions and the conditions for applying them function to provide the desired results. The examples will serve to further typify the nature of this invention but should not be construed as a limitation to the scope thereof which scope is defined solely in the appended claims.

EXAMPLES

Parmod® Silver Ink A (silver flake, silver necadecanoate in neodecanoic acid with a 6 to 1 ratio of flake to silver neodecanoate and 3 roll milling) was prepared as described in U.S. Pat. No. 6,036,889. Parmod® Silver Ink B contains the ingredients of Ink A with dipropylene glycol methyl ether added at 1.1 weight %. Roll milling was performed on a Ross® 3 roll mill; screen printing on a Presco® screen printer; furnace was a Hotpack® convection oven; cross-sectional area was measured using a Dektak® II.

Example 1

PARMOD® Silver Ink A 100 wt %

Figure 1:
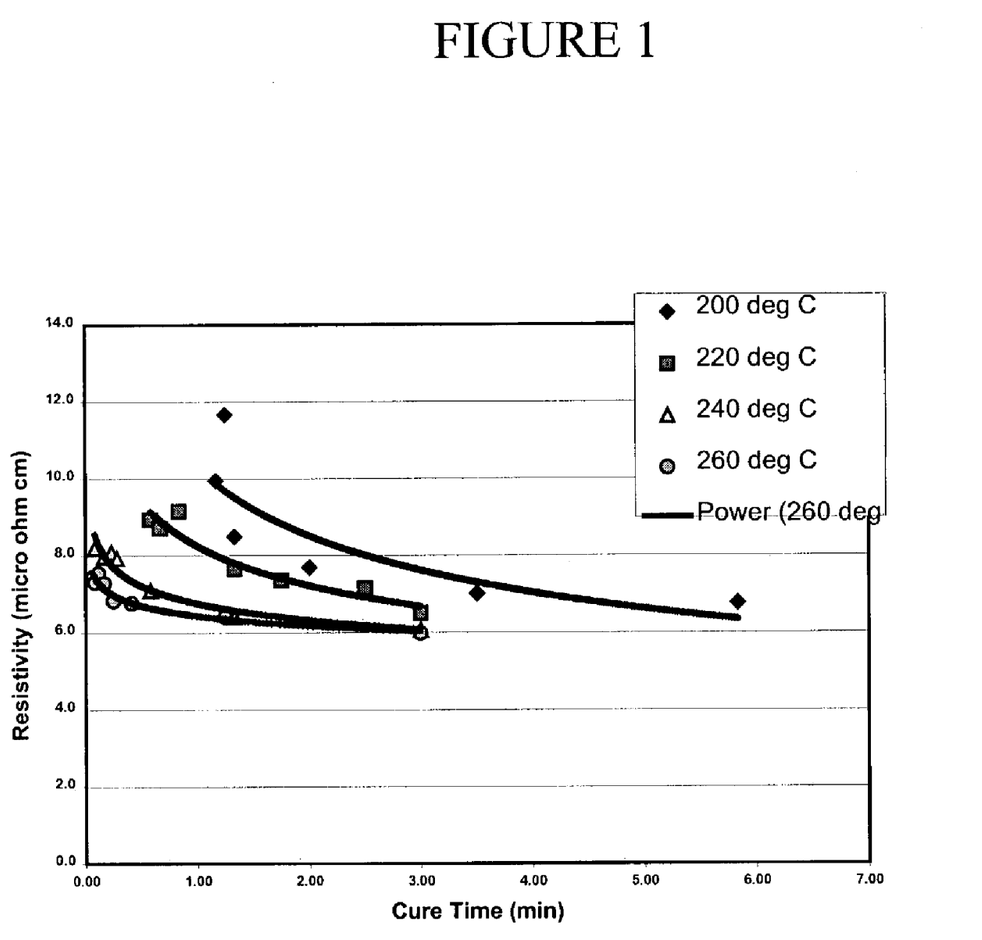
FIG. 1 shows the resistivity versus time measured for the circuit pattern comprising silver, and an epoxy-based substrate, without a cure temperature lowering agent, as described in Example 1.

The ink was screen printed into a resistivity pattern onto 3 mil KAPTON® H substrates. The samples were then thermally treated at 1 to 30 minutes at temperatures of 190° C. to 300° C. in an air atmosphere. The resistance and cross-sectional area of the pattern were measured and used to calculate resistivity.

$$\rho = (R*A)/l$$

where R=resistance (ohms), A=cross-sectional area (cm$^2$), and l=length (cm)

The resistivity versus time data is shown in FIG. 1. The results demonstrate that the minimum lowest cure temperature of the ink which still provided measurable resistance in the circuit trace was 200° C. Above 200° C., the resistivity of the ink decreased asymptotically as the cure time and temperature were increased.

Example 2

| | |
|---|---|
| PARMOD ® Silver Ink A | 98.9 wt % |
| Di(propylene glycol) methyl ether | 1.1 wt % |

The ink was used to screen print a resistivity pattern onto 3 mil KAPTON® H substrates. The samples were then thermally cured at 60 to 1,800 seconds and at temperatures of 140° C. to 350° C. in an air atmosphere. The resistance and cross-sectional area of the pattern were measured and used to calculate resistivity.

Figure 2:
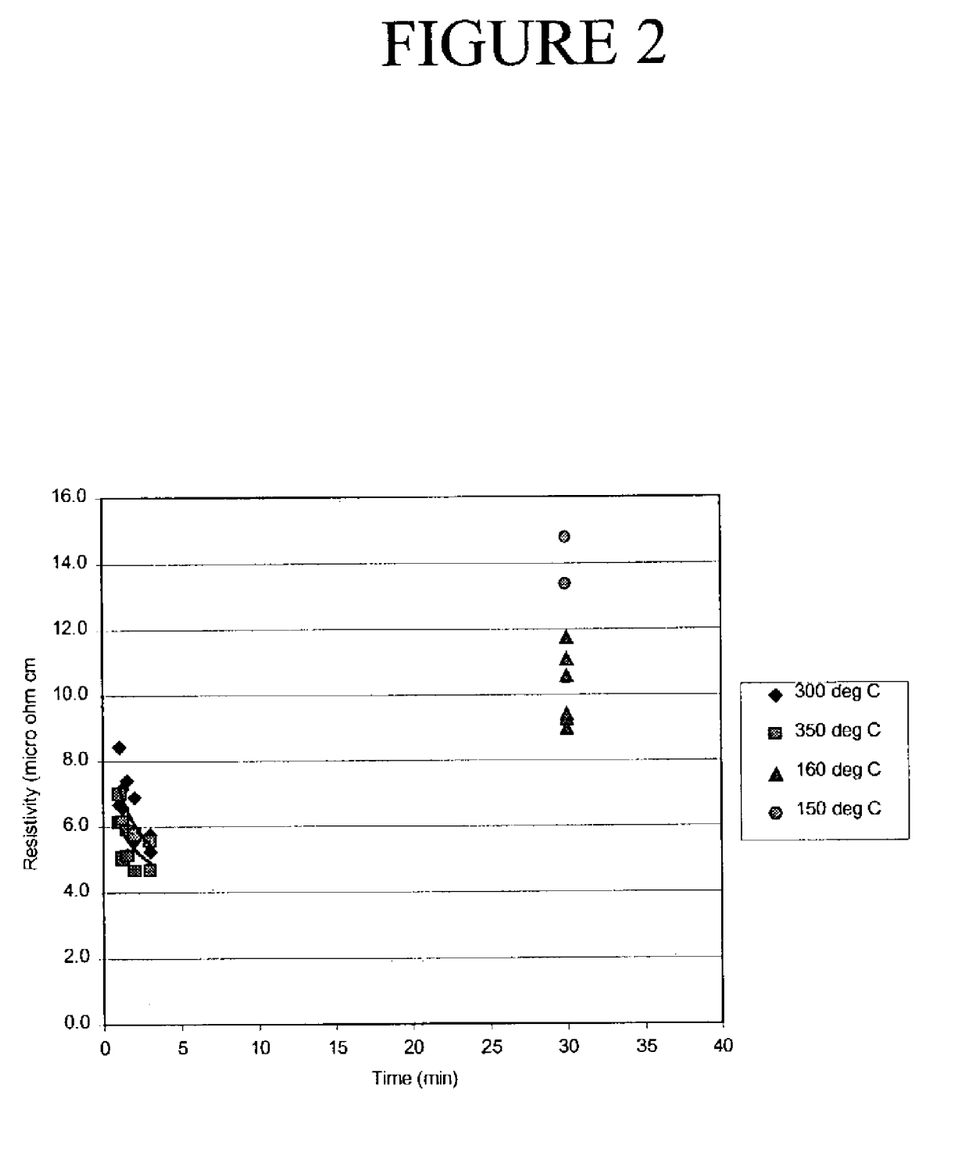
FIG. 2 shows the resistivity versus time measured for the circuit pattern comprising silver, an epoxy-based substrate, and dipropylene glycol methyl ether as the cure temperature lowering agent, as described in Example 2.

The resistivity versus time data is shown in FIG. 2. The results show that the addition of di(propylene glycol)methyl ether lowered the minimum ink cure temperature. The lowest cure temperature of the ink which still provided measurable resistance in the circuit trace was 150° C. The resistivity of the ink decreased with increased cure time and temperature.

Example 3

PARMOD® Silver Ink B 100 wt %
Substrate
SARAN® coated Polyester 2.5, 7.5, and 15 micron coating thicknesses The ink was used to screen print a resistivity pattern onto three SARAN® (Dow Chemcals) coated polyester substrates of differing thicknesses. The SARAN® was coated on bare Melinex® polyester (DuPont-Teijin) using different wire-wound rods to provide the desired thicknesses. The samples were then thermally cured at 15 and 30 minutes and at temperatures of 125° C. and 150° C. in an air atmosphere. The resistance and cross-sectional area of the pattern were measured and used to calculate resistivity.

Figure 3:
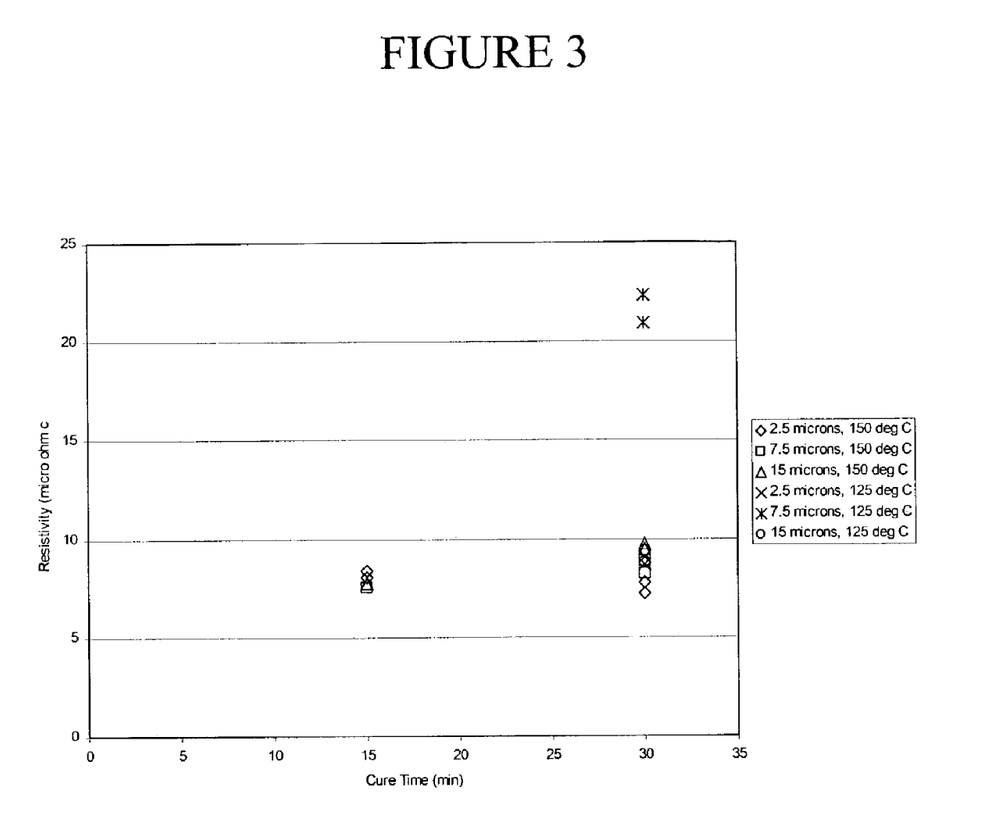
FIG. 3 shows the resistivity versus time measured for the circuit pattern comprising silver, a polyester-based substrate, and SARAN® as the cure temperature lowering agent, as described in Example 3.

The resistivity versus time data is shown in FIG. 3. The results demonstrate that coating the polyester substrate with SARAN® lowered the minimum ink cure temperature. The minimum lowest cure temperature of the ink which still provided measurable resistance in the circuit trace was 125° C. The resistivity of the ink was not time dependent under these conditions at 150° C., but at 125° C. only the samples cured for 30 minutes had measurable resistances. The thickness of the SARAN® coating also had an effect on the resistivity of samples cured at 125° C., with the thicker coatings providing samples with lower resistivity.

Example 4

| | |
|---|---|
| PARMOD ® Silver Ink B | 95 wt % |
| DARAN ® 8730 Latex | 5 wt % |

DARAN® (WR Grace) is a polymer of vinylidene chloride, butyl acrylate and acrylonitrile polymer emulsion.

The ink and latex were mixed and rolled through a three roll mill. The ink mixture was used to screen print a resistivity pattern onto 3 mil Melinex® polyester substrates. The samples were then thermally cured at 2 to 30 minutes and at temperatures of 135° C. and 150° C. in an air atmosphere. The resistance and cross-sectional area of the pattern were measured and used to calculate resistivity.

Figure 4:
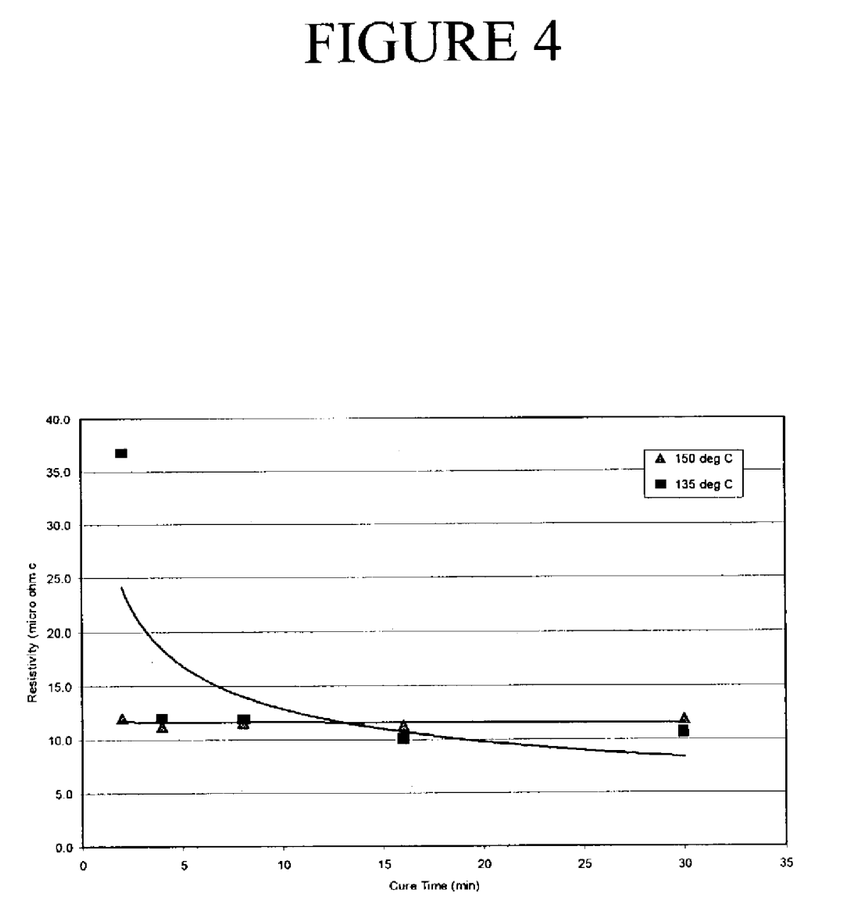
FIG. 4 shows the resistivity versus time measured for the circuit pattern comprising silver, a polyester-based substrate, and DARAN® 8730 latex as the cure temperature lowering agent, as described in Example 4.

The resistivity versus time data is shown in FIG. 4. The results demonstrate that the addition of the DARAN® polymer reduced the minimum curing temperature of the ink. The lowest cure temperature of the ink which still provided measurable resistance in the circuit trace was 135° C. when heated for 2 minutes, a temperature suitable for the polyester substrate. The resistivity of the ink decreased with increased cure time and temperature.

Example 5

| | |
|---|---|
| PARMOD ® Silver Ink A | 95 wt % |
| DARAN ® 8600C Latex | 5 wt % |

The ink and latex were mixed and rolled through a three roll mill. The ink mixture was used to screen print a resistivity pattern onto 3 mil polyester substrates. The samples were then thermally cured at 2 to 30 minutes and at temperatures of 135° C. and 150° C. in an air atmosphere. The resistance and cross-sectional area of the pattern were measured and used to calculate resistivity.

Figure 5:
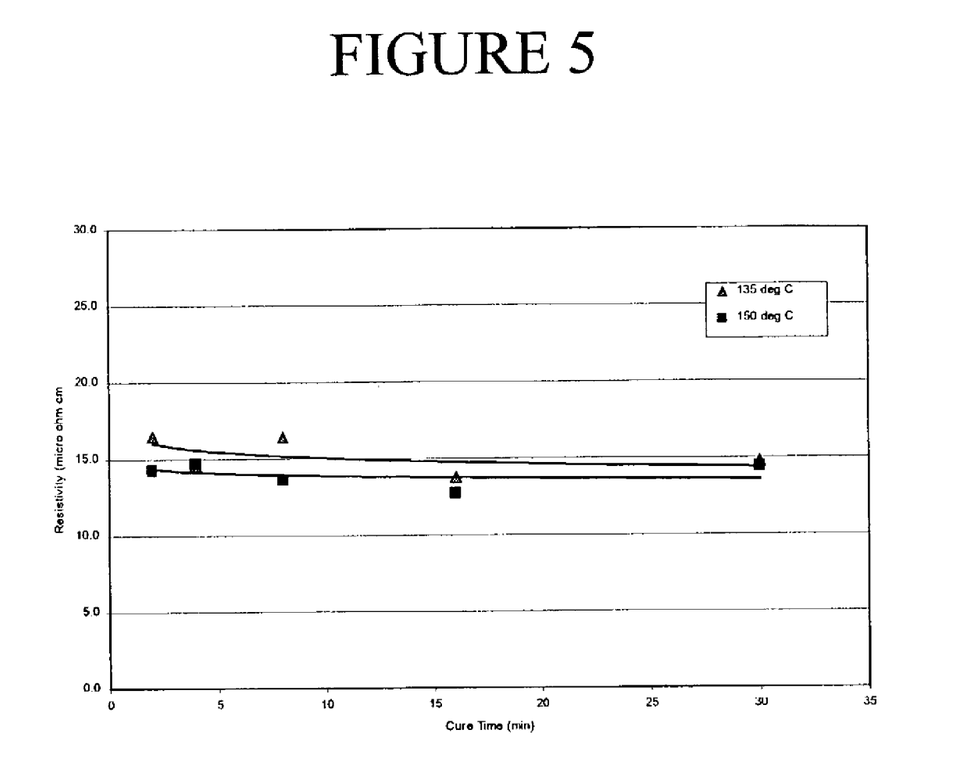
FIG. 5 shows the resistivity versus time measured for the circuit pattern comprising silver, a polyester-based substrate, and DARAN® 8600 latex as the cure temperature lowering agent, as described in Example 5.

The resistivity versus time data is shown in FIG. 5. The results demonstrate that the addition of the DARAN® polymer reduced the minimum curing temperature of the ink. The lowest cure temperature of the ink which still provided measurable resistance in the circuit trace was 135° C. when heated for 2 minutes. The resistivity of the ink decreased with increased cure time and temperature.

Example 6

Formulation

| | |
|---|---|
| PARMOD ® Silver Ink B | 95 wt % |
| AIR FLEX ® EVC 4530 | 5 wt % |

The ink and AIR FLEX® (polyethylene vinyl chloride copolymer, Air Products and Chemicals) were mixed and rolled through a three roll mill. The ink was used to screen print a resistivity pattern onto 3 mil Melinex® polyester substrates. The samples were then thermally cured at 2 to 30 minutes and at temperatures of 135° C. and 150° C. in an air atmosphere. The resistance and cross-sectional area of the pattern were measured and used to calculate resistivity.

Figure 6:
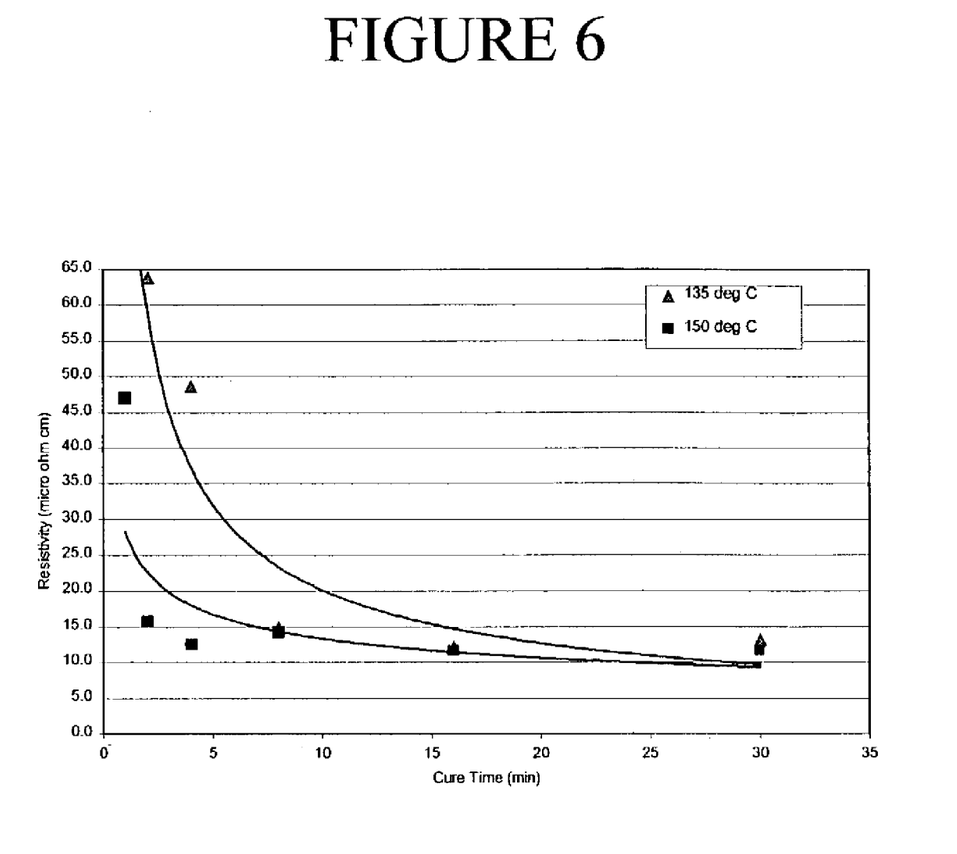
FIG. 6 shows the resistivity versus time measured for the circuit pattern comprising silver, a polyester-based substrate, and AIRFLEX® 4530 as the cure temperature lowering agent, as described in Example 6.

The resistivity versus time data is shown in FIG. 6. The results demonstrate that the minimum lowest cure temperature of the ink that still provided measurable resistance in the circuit trace was 135° C. when heated for 2 minutes. The resistivity of the ink decreased with increased cure time and temperature.

Example 7

| PARMOD ® B | 96 wt. % |
|---|---|
| DARAN ® 8730 | 3 wt. % |
| polystyrene acrylate latex (Dow) | 1 wt. % |

The ink, DARAN® and latex were mixed and rolled through a three roll mill. The ink mixture was printed on 175 g/m² paper (Wausau Paper) and cured in a convection oven for 2 and 5 minutes at 135° C. and 150° C.

Figure 7:
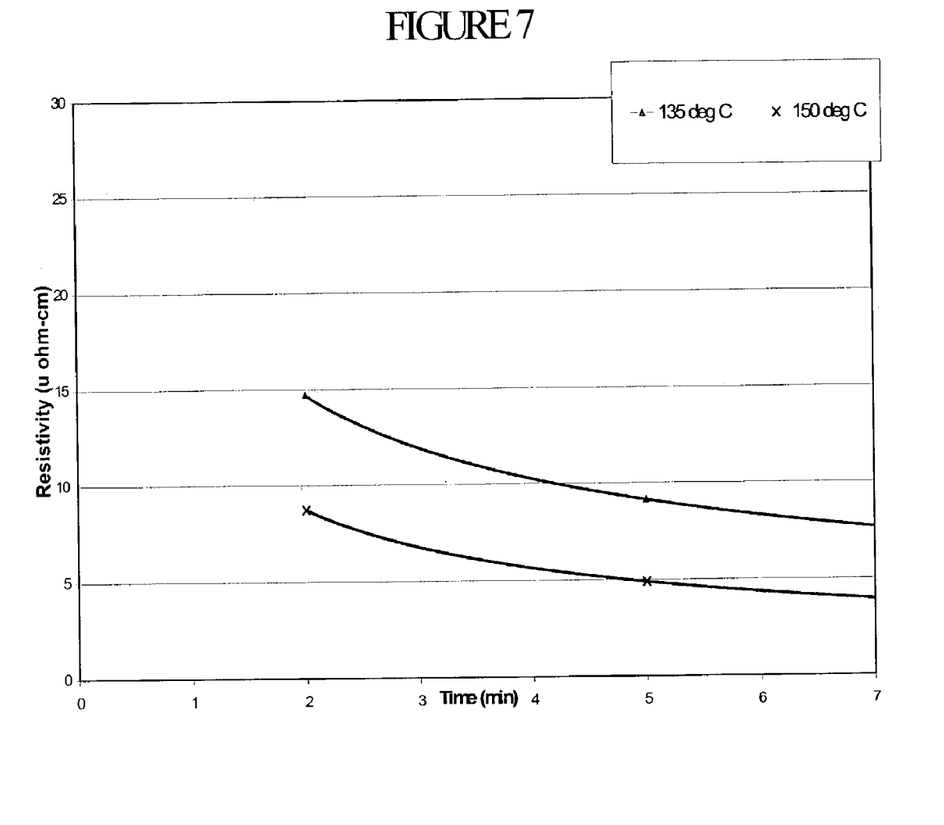
FIG. 7 shows the resistivity versus time measured for the circuit pattern comprising silver, a paper-based substrate, and DARAN® 8730 and polystyrene acrylate latex as the cure temperature lowering agent, as described in Example 7.

The resistivity vs. time and temperature data are shown in FIG. 7. The results demonstrate that the minimum lowest cure temperature of the ink that still provided measurable resistance in the circuit trace was 135° C. when heated for 2 minutes. The resistivity of the ink decreased with increased cure time and temperature.

Example 8

| PARMOD ® base Ink B | 94 wt % |
|---|---|
| AIRFLEX ® 4530 | 5 wt % |
| RODA | 1 wt % |

Figure 8:
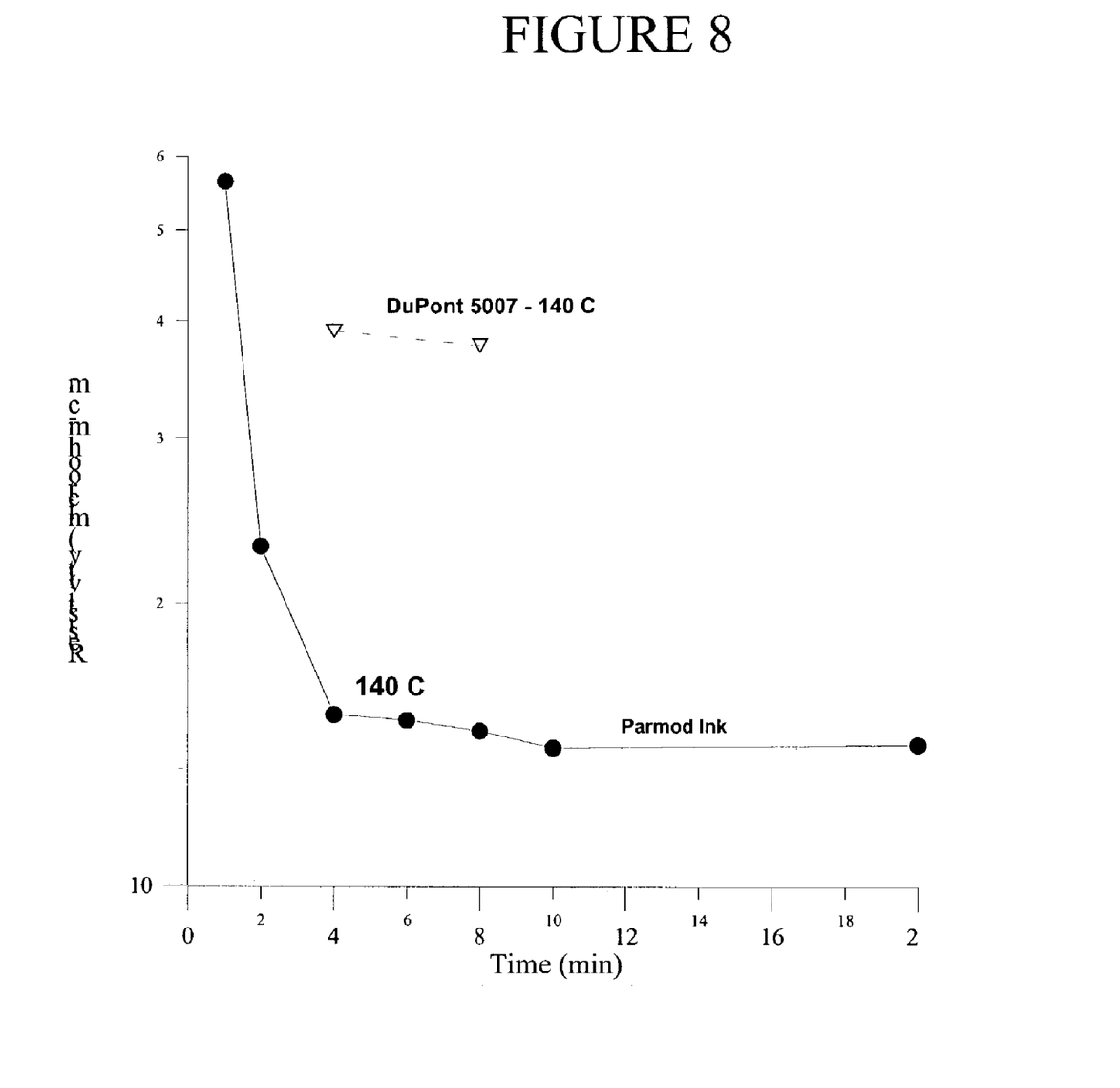
FIG. 8 shows a comparison of the resistivity versus time measured for the circuit pattern comprising a composition comprising silver, a polyester-based substrate, and AIRFLEX® 4530, and a circuit pattern comprising a commercially available ink composition without a cure temperature lowering agent, as described in Example 8.

The ink, AIRFLEX® and RODA were mixed and rolled through a three roll mill. The ink mixture was screen printed onto 5 mil uncoated PET and heat-treated at 140° C. for various lengths of time between 1 and 20 minutes. As a comparison, resistivity patterns were also printed with commercially available DuPont 5007 ink and heat-treated at 140° C. for 4 and 8 minutes. FIG. 8 shows the plot of resistivity versus time data for both types of ink compositions.

The data shown in FIG. 8 demonstrate that the compositions of the present invention have lower resistivity and therefore higher conductivity than the commercially available ink composition that did not contain a cure temperature lowering agent.

The invention claimed is:

1. A conductive ink composition for deposition onto a substrate comprising a mixture of
   (a) a metallo-organic decomposition compound;
   (b) a metal powder present in an amount 1 to 20 times the amount of the metallo-organic decomposition compound by weight; and
   (c) a latex polymer cure temperature lowering agent.

2. The composition of claim 1, wherein the metal powder is silver.

3. The composition of claim 1, wherein the cure temperature lowering agent is a latex polymer selected from polyvinylidene chloride, polyvinyl chloride, polyethylene vinyl chloride, or copolymers thereof.

4. The composition of claim 1, wherein the cure temperature lowering agent is present in an amount of 0.5 to 10% weight in the composition.

5. The composition of claim 1, wherein the metal powder has an average particle size of from about 0.05 to 15 µm.

6. The composition of claim 1, further comprising an organic liquid vehicle.

7. The composition of claim 6, wherein the organic liquid vehicle is present in an amount of 0.05 to 100 times the amount of the metallo-organic decomposition compound by weight.

8. A conductive ink composition for deposition onto a substrate comprising a mixture of
   (a) a metallo-organic decomposition compound;
   (b) a metal powder present in an amount 1 to 20 times the amount of the metallo-organic decomposition compound by weight; and
   (c) a latex polymer cure temperature lowering agent in an amount of about 0.5 to 10% by weight.

9. The composition of claim 8, further comprising an organic liquid vehicle.

10. The composition of claim 9, wherein the organic liquid vehicle is present in an amount of 0.05 to 100 times the amount of the metallo-organic decomposition compound by weight.

11. The composition of claim 8, wherein the cure temperature lowering agent is a latex polymer selected from polyvinylidene chloride, polyvinyl chloride, polyethylene vinyl chloride, or copolymers thereof.

12. The composition of claim 8, wherein the metal powder has an average particle size of from about 0.05 to 15 µm.

13. A method for preparing an electrically conductive ink composition for deposition onto a substrate comprising mixing
   (a) a metallo-organic decomposition compound;
   (b) a metal powder present in an amount 1 to 20 times the amount of the metallo- organic decomposition compound by weight; and
   (c) a latex polymer cure temperature lowering agent in the amount of 0.5 to 10% by weight to form an electrically conductive ink composition.

14. The method of claim 13, further comprising roll milling the mixture to produce a homogeneous composition.

15. The method of claim 13, wherein the metal powder has an average particle size of from about 0.05 to 15 µm.

16. The method of claim 13, wherein the cure temperature lowering agent is a latex polymer selected from polyvinylidene chloride, polyvinyl chloride, polyethylene vinyl chloride, or copolymers thereof.

17. The method of claim 13, wherein the metal is silver.

18. A conductive ink composition for deposition onto a substrate comprising a mixture of:
   (a) a reactive organic medium, wherein the reactive organic medium is a metallo-organic decomposition compound;
   (b) a metal powder;
   (c) a latex polymer cure temperature lowering agent; and
   (d) an organic liquid vehicle present in an amount of 0.05 to 100 times the amount of the metallo-organic decomposition compound by weight.

19. The composition of claim 18, wherein the metal powder is silver.

20. The composition of claim 18, wherein the cure temperature lowering agent is a latex polymer selected from the group consisting of polyvinylidene chloride, polyvinyl chloride, polyethylene vinyl chloride, or copolymers thereof.

21. The composition of claim 18, wherein the metal powder is present in an amount 1 to 20 times the amount of the metallo-organic decomposition compound by weight.

22. The Composition of claim 18, wherein the cure temperature lowering agent is present in an amount of 0.5 to 10% weight in the composition.

23. The Composition of claim 18, wherein the metal powder has an average particle size of from about 0.05 to 15 μm.

* * * * *